(12) United States Patent
Ricotti (10) Patent No.: US 7,521,984 B2
(45) Date of Patent: Apr. 21, 2009

(54) DRIVING CONFIGURATION OF A SWITCH

(75) Inventor: Giulio Ricotti, Broni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/753,839

(22) Filed: May 25, 2007

(65) Prior Publication Data

US 2007/0273427 A1 Nov. 29, 2007

(30) Foreign Application Priority Data

May 26, 2006 (EP) .................................. 06425359

(51) Int. Cl.
*H03K 17/687* (2006.01)

(52) U.S. Cl. .................... 327/427; 327/318; 327/321; 361/90; 361/91.1; 361/92

(58) Field of Classification Search .................. 327/427
See application file for complete search history.

(56) References Cited

U.S. PATENT DOCUMENTS 4,801,821 A 1/1989 Prevost et al.
5,635,821 A 6/1997 Smith
6,759,888 B1 7/2004 Wodnicki
7,304,530 B2 * 12/2007 Wei et al. ..................... 327/536

* cited by examiner

*Primary Examiner*—Kenneth B Wells
*Assistant Examiner*—John W Poos
(74) *Attorney, Agent, or Firm*—Lisa K. Jorgenson; E. Russell Tarleton; Seed IP Law Group PLLC (57) ABSTRACT

A driving circuit of a switch includes first and second transistors connected in series to each other and to relative intrinsic diodes in antiseries and driven by a driving device that includes at least one first and one second output terminal connected to the switch to supply it with a first control signal for driving the switch in a first working state and a second control signal for driving the switch in a second working state. At least one latch circuit coupled between respective common gate and source terminals of the first and second transistors supplies the common gate terminal with the first and second control signals, respectively, according to the working state to turn off and turn on the first and second transistors.

26 Claims, 5 Drawing Sheets

DRIVING CONFIGURATION OF A SWITCH

BACKGROUND

1. Technical Field

The present disclosure relates to the driving configuration of a switch and, more specifically, to a driving configuration of a switch realized by means of a first and a second transistor connected in series to each other and to the relative intrinsic diodes in antiseries and driven by a driving device, including, without limitation, a driving configuration of a high voltage (HV) switch.

2. Description of the Related Art

As is well known, a driving device of a high voltage (HV) switch, usually realized by means of a MOS transistor, is specified to instantaneously follow the voltage dynamics of a signal to be switched.

In general, a switch realized by means of a high voltage MOS or DMOS transistor is able to manage high voltages between its drain and source terminals, as well as with respect to a substrate potential. The highest voltage value Vgs between its gate and source terminals is however limited to some volts (3V or 5V).

In particular, when the switch is off it must be able to interrupt the passage of current independently from the voltage polarity at its ends. Further to the connection of the body terminal to the source terminal, a junction is created between the source and drain terminals, which prevents the inversion of the polarity across the switch without triggering a passage of current in the intrinsic diode thus created even if the relative channel is off.

To overcome this drawback, the switch is realized by placing two MOS or DMOS transistors in series, so that the relative intrinsic diodes are biased in antiseries, i.e., with a pair of corresponding terminals, in particular respective anodes, in common. In this way, at least one intrinsic diode of the switch is always inversely biased.

In this case a driving device or driver is to be provided that is able to follow a turn on/off command of the switch and to apply a first turn on voltage value (for example equal to 5V) between the gate and source terminals of the transistors contained in the switch when the switch itself is to be turned on and a second turn off voltage value (for example equal to 0V) between the gate and source terminals of the transistors contained in the switch when it is to be turned off.

Figure 1:
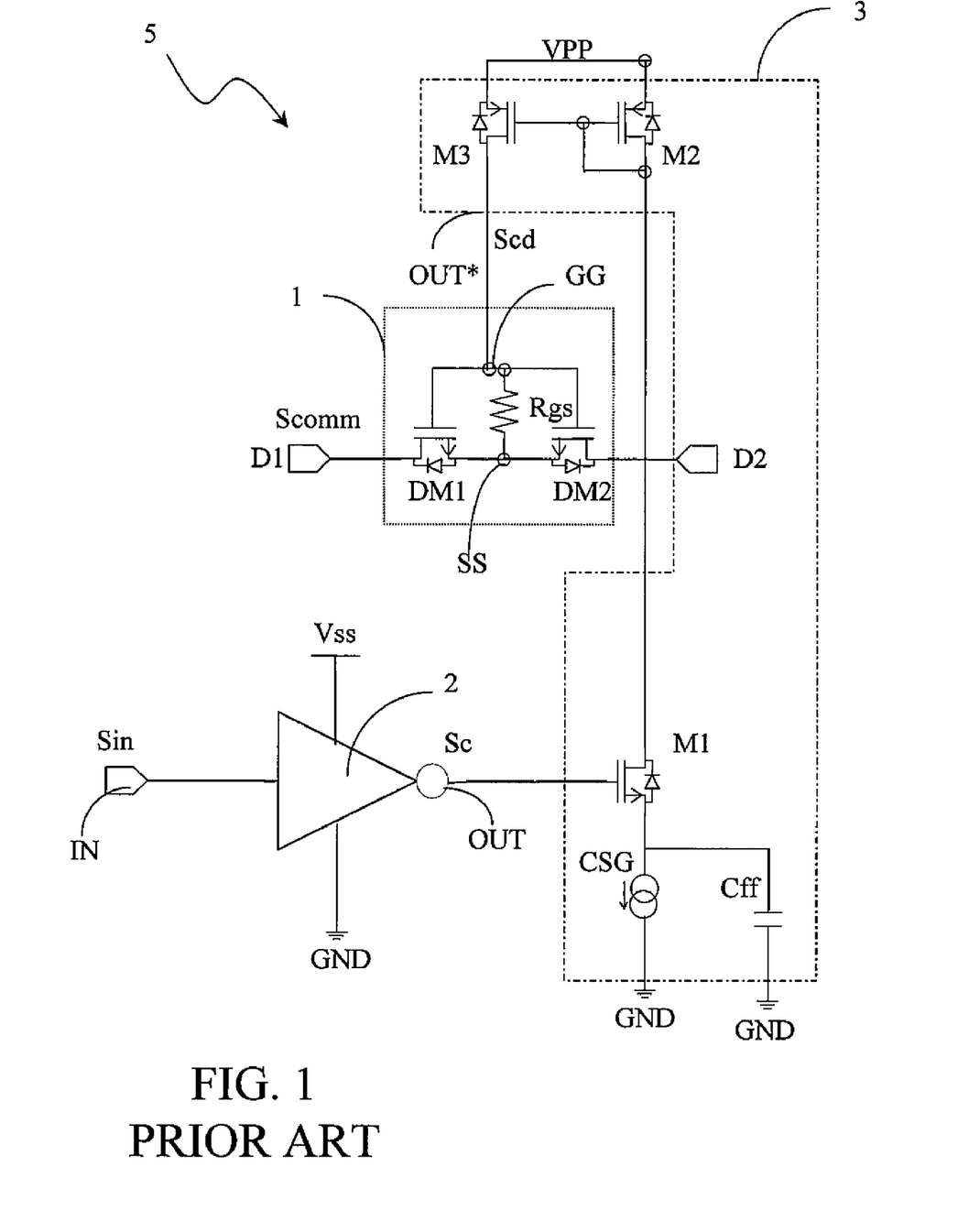
FIG. 1 schematically shows a driving configuration of a high voltage switch realized according to prior designs.

Schematically shown in FIG. 1 is a configuration 5 of a driven switch including a switch 1 realized by means of two DMOS transistors, DM1, DM2, connected in series with intrinsic diodes in antiseries and driven by means of a driving device or driver 2.

In particular, this configuration 5 has a resistive element Rgs that connects respective common source SS and gate GG terminals of the DM1 and DM2 transistors of the switch 1. The DM1 and DM2 transistors also have respective drain terminals, D1 and D2.

The driver 2 is inserted between a first and a second voltage reference, respectively a supply Vss (for example equal to 3.3V) and a ground GND (for example equal to 0V), and it has an input terminal IN receiving a driving signal Sin for driving the switch 1 in a first on state (ON) and in a second off state (OFF). In particular, the driving signal Sin is a digital signal having a first level or 0 logic corresponding to a demand for turn on of the switch 1 and a second level or 1 logic corresponding to a demand for turn off of the switch 1.

The driver 2 also has an output terminal, OUT, connected, by means of a level shifter 3 to the gate terminals GG of the switch 1. On the output terminal OUT of the driver 2 there is a control signal Sc for the switch 1, derived from the driving signal Sin applied to its input terminal IN In fact, it is to be emphasized that in high voltage applications the voltage value at the drain and source terminals of the transistors in the switch 1 must take all the values between a negative −HV and a positive +HV high voltage reference, for example equal to 100V and a level shifter 3 is thus to be used. The shifter is able to shift a control signal Sc referred to the ground GND and to refer it to an instantaneous level of a signal Scomm to be switched and applied to a terminal of the switch 1, in particular to the D1 and D2 drain terminals.

As shown in FIG. 1, the level shifter 3 is realized in a simple and functional way so as to convert the control signal Sc in voltage (referred to the GND) into a control signal in current and then again into a control signal Scd derived in voltage referred to the common source terminals SS of the DM1 and DM2 transistors comprised in the switch 1.

For realizing this conversion, the level shifter 3 includes a first transistor M1 having a control or gate terminal connected to the output terminal OUT of the driver 2, a first conduction terminal, in particular a source terminal, connected, by means of the parallel of a current generator CSG (in particular a low voltage one) and of a capacitor Cff (so called feed forward capacitor), to the GND, as well as a second conduction terminal, in particular a drain terminal, connected to a shifted voltage reference VPP (equal to a high voltage value, for example +3V) by means of a current mirror realized by a second M2 and a third M3 transistor.

In particular, the second transistor M2 is inserted between the shifted voltage reference VPP and the drain terminal of the first transistor M1, it is diode configured, and it has a gate terminal connected to the gate terminal of the third transistor M3, in turn inserted between the shifted voltage reference VPP and an output terminal OUT* of the level shifter 3, in turn connected to the gate terminals GG of the switch 1.

Although advantageous under several aspects, this known configuration shows a serious drawback linked to the sizing of the resistive element Rgs inserted between the common gate GG and the source SS terminals of the DM1 and DM2 transistors of the switch 1.

In fact, if the switch 1 is to be switched quickly, this resistive element Rgs is to be sized with a relatively small value so that the time constant τ given by the resistive element Rgs itself and by the parasitic capacitances Cpar associated with the gate nodes is brief and smaller than a switch time Tcomm (in this case, a turn off time) desired. In particular, it results in:

$$\tau = Rgs * Cpar < Tcomm \tag{1}$$

Thus, by using a small resistance value for the resistive element Rgs so as to meet the above reported relation (1), a high current value Ion is however to be provided during the turn on, this current value having in fact to meet, for the voltage between the gate and source terminals of the DM1 and DM2 transistors, the following relation:

$$Vgs = Rgs * Ion = 5V \tag{2}$$

In other words, the configuration 5 shown in FIG. 1 must use a variable resistance being small when the switch 1 is off and high when it is on.

Figure 2A:
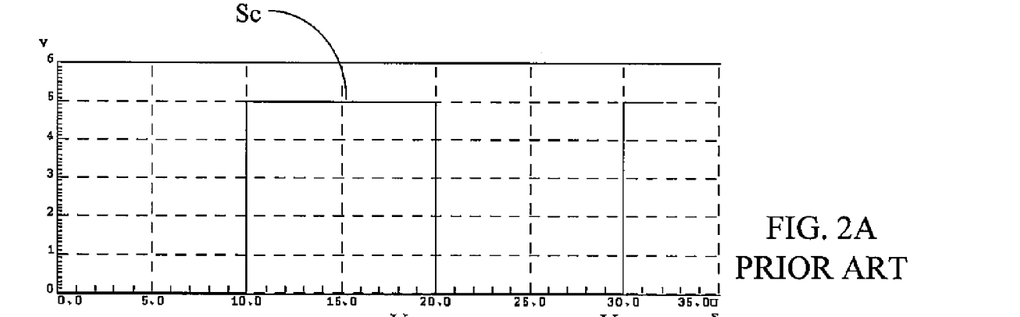
FIGS. 2A-2C show the results of a simulation carried out on the driving configuration of FIG. 1.
Figure 2B:
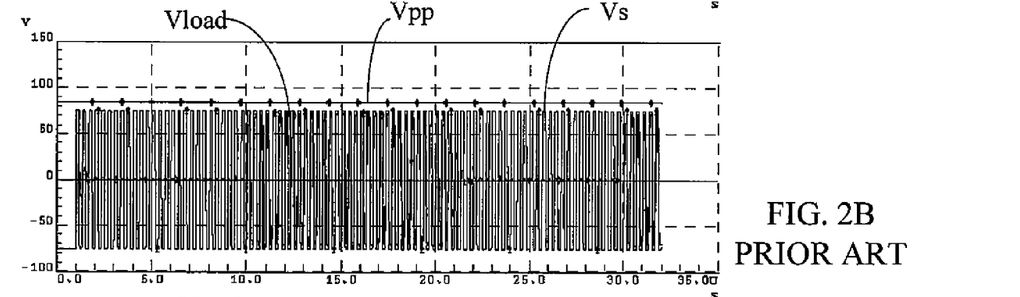
Figure 2C:
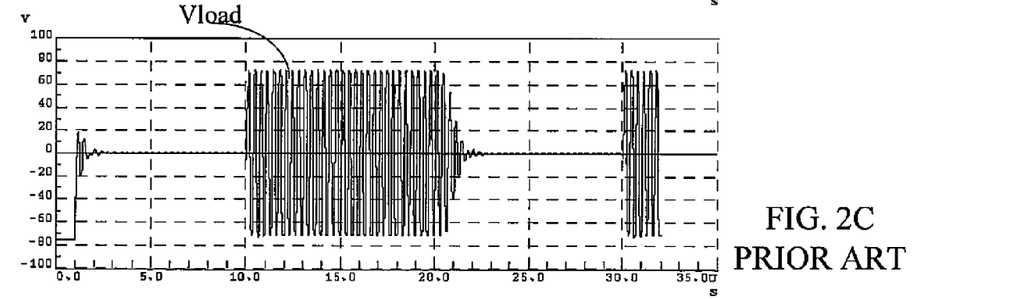

Such a configuration 5, using a resistive element Rgs of 500 kOhm, has been simulated in which the switch 1 connects a load to a source of a voltage signal Vs. The results of this simulation are shown in FIGS. 2A, 2B, and 2C. In particular, FIG. 2A shows a control signal Sc of the switch 1, for which a void voltage value (Sc=0) corresponds to a condition of open switch, and a voltage value equal to Vpp (Sc=5V) corresponds to a condition of closed switch. FIG. 2B shows the supply voltage signal Vpp, the source voltage signal Vs, and the voltage signal that is obtained on the load Vload, overlapped onto each other, while FIG. 2C reports the signal on the load Vload only. Thus, the switch 1 works correctly and reports the source voltage value Vs on the load (Vload signal overlapped onto Vs in FIG. 2B) as soon as the control signal Sc is brought to Vpp (turn on of the switch 1). This switch 1 does not however work correctly during the turn off (Sc is brought back to 0) since the voltage signal on the load Vload dampens only gradually starting from 20 microseconds (time in which the control signal Sc is interrupted in FIG. 2C), the turn off being relied only upon the resistive element Rgs. From these results, it is immediate to verify how such a value of the resistive element Rgs thus implies a long turn off time of the switch 1.

The technical problem is that of providing a driving configuration of a high voltage switch able to associate, with a quick switch transient, a reasonable control current value while overcoming the limits and drawbacks still affecting the configurations realized according to the foregoing description.

BRIEF SUMMARY OF THE INVENTION

The present disclosure is directed to introducing between the gate and source terminals of a switch driven by a driver, a latch circuit able to realize a correct connection of these gate terminals to suitable current values according to the working conditions of the switch itself, in particular during turn on and off conditions.

In accordance with one embodiment of the present disclosure, a driving circuit is provided for a switch that includes first and second transistors coupled in series to each other and to relative intrinsic diodes in antiseries and driven by the driving circuit, the driving circuit including at least one first and one second output terminal coupled to the switch and adapted to supply the switch with a first control signal for driving said switch in a first working state and a second control signal for driving said switch in a second working state, and in that it includes at least one latch circuit coupled between respective common gate and source terminals of said first and second transistors and adapted to supply said common gate terminal with said first and second control signals, respectively, according to said working state for the turn off, and respectively the turn on, of said first and second transistors.

In accordance with another aspect of the foregoing embodiment, the driving circuit includes at least one first and one second generator of the control signals connected by means of respective first and second switches driven by respective control signals to the first and second output terminals of the driving device.

In accordance with another aspect of the foregoing embodiment, the latch circuit includes at least one first and one second latch transistor coupled between the common gate and source terminals and coupled in positive reaction to each other, the first latch transistor coupled between the first output terminal of the driving device and the common source terminal and having a gate terminal coupled to the common gate terminal, and the second latch transistor coupled between the second output terminal of the driving device, in turn coupled to the common gate terminal, and the common source terminal, and having a gate terminal coupled to the first output terminal of the driving device.

In accordance with another aspect of the foregoing embodiment, the latch circuit includes respective clamp circuits coupled between the first and second gate terminals, respectively, and the common source terminals. Ideally, each clamp circuit includes at least one Zener diode and one capacitor coupled in parallel to each other and coupled between the first and second gate terminals and the common source terminal. Preferably, the latch transistors are low voltage N channel MOS transistors.

In accordance with another aspect of the foregoing embodiment, the latch circuit includes at least one flip flop coupled to the common source terminal and having a reset terminal coupled to the first output terminal of the driving device and to the common source terminal by means of a reset resistance, a set terminal coupled to the second output terminal of the driving device and to the common source terminal by means of a set resistance, and an output terminal coupled to the common gate terminal.

In accordance with another aspect of the foregoing embodiment, the flip flop is supplied through a circuit node by means of a rectifier coupled to the first and second output terminals of the driving device.

In accordance with another embodiment of the present disclosure, a switch circuit is provided that includes a switch having first and second transistors coupled in series to one another; and a driving circuit coupled to the switch, the driving circuit including a first current source coupled to a first latch transistor and coupled to a control terminal of a second latch transistor; a second current source coupled to the second latch transistor and to a control terminal of the first latch transistor; the first and second latch transistors each coupled to a common source terminal of the first and second transistors; and first and second clamp circuits coupled between the respective control terminals of the first and second latch transistors and the common source terminal.

In accordance with another aspect of the foregoing embodiment, the switch circuit includes first and second current sources coupled to the respective latch transistors by first and second respective switches, the second switch having a control terminal to receive a control signal and the first switch having a control terminal to receive the control signal in an inverted state. Preferably, the circuit includes first and second clamp circuits, each having a Zener coupled in parallel with a capacitor.

In accordance with another embodiment of the present disclosure, a switch circuit is provided that includes a driving circuit having first and second current sources coupled to respective first and second outputs via respective first and second switches, the second switch controlled by a control signal and the first switch controlled by the inverted control signal; and a switch, the switch including first and second transistors coupled in series to each other and to relative intrinsic diodes in antiseries and having a first input coupled to the first output of the driving circuit and a second input coupled to the second output of the driving circuit, the first input coupled to a first terminal of a latch circuit and the second input terminal coupled to a second terminal of the latch circuit, and an output of the latch circuit coupled to control terminals of the first and second transistors, and a fourth terminal coupled to a common source terminal between the first and second transistors, the switch further comprising a clamp circuit coupled to the latch circuit and to the common source terminal.

BRIEF DESCRIPTION OF THE SEVERAL VIEWS OF THE DRAWINGS

The characteristics and the advantages of the driving configuration according to the invention will be apparent from the following description of an embodiment thereof given by way of indicative and non limiting example with reference to the annexed drawings, in which.

DETAILED DESCRIPTION

Figure 3:
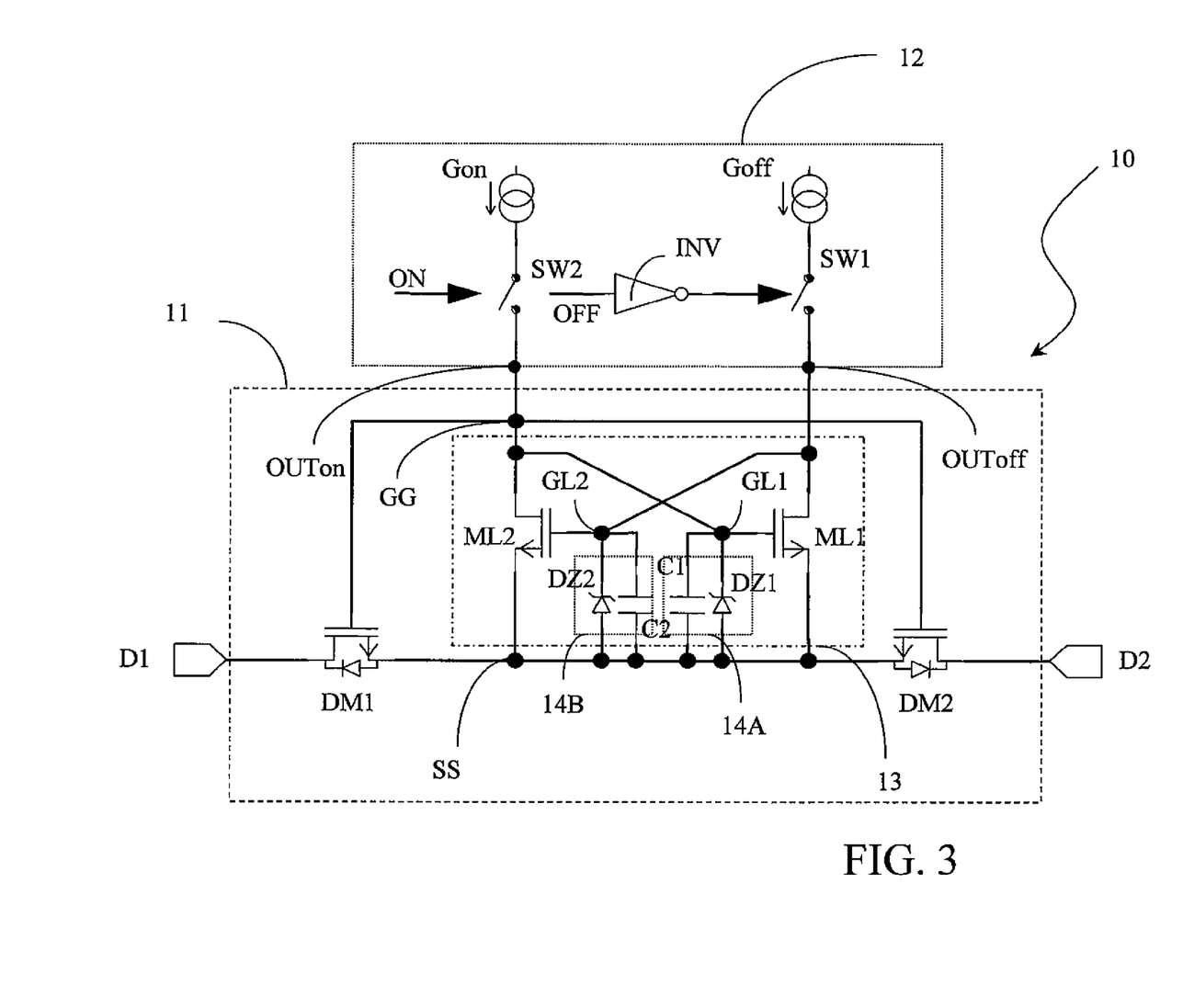
FIG. 3 schematically shows a driving configuration realized according to the present disclosure.

With reference to these figures, and in particular to FIG. 3, a driving configuration of a switch 10, in particular a high voltage switch driven by a driving device or driver is globally and schematically illustrated.

Elements structurally and functionally corresponding to the driving configuration described in relation to FIG. 1 will be given the same reference numbers by way of illustration.

In particular, the driving configuration 10 includes a switch 11 realized by means of first and second transistors, DM1 and DM2, in particular MOS or DMOS transistors, connected, in series to each other and to relative intrinsic diodes in antiseries, i.e., to a pair of corresponding terminals, in particular anodes, in common.

The switch 11 is driven by a driving device or driver 12 having first OUT"off" and second OUT"on" output terminals connected to the switch 11.

The driver 12 essentially includes first Goff and second Gon control current generators connected, by means of respective first SW1 and second SW2 driven switches, to the first OUToff and second OUTon output terminals of the driver 12 itself. In particular, the first switch SW1 is driven, by means of an inverter INV, by a first turn off command OFF, while the second switch SW2 is driven by a second turn on command ON.

Advantageously according to this embodiment, the driving configuration 10 further includes a latch circuit 13 coupled between common respective source SS and gate GG terminals of the DM1 and DM2 transistors of the switch 11.

The latch circuit 13 has at least one first ML1 and one second ML2 latch transistor coupled between the source SS and gate GG terminals in positive reaction to each other, i.e., in latch configuration (more exactly, a semi-latch). In particular, the first latch transistor ML1 is coupled between the first output terminal OUToff of the driver 12 and the source terminal SS and it has a control or gate terminal GL1 connected to the gate terminal GG; similarly, the second latch transistor ML2 is coupled between the second output terminal OUTon of the driver 12, in turn connected to the gate terminal GG, and the source terminal SS and it has a control or gate terminal GL2 connected to the first output terminal OUToff of the driver 12.

The latch circuit 13 further includes a first Zener diode DZ1 and a first capacitor C1 coupled, in parallel to each other, between the gate terminal GL1 of the first latch transistor ML1 and the source terminal SS, as well as a second Zener diode DZ2 and a second capacitor C2 coupled, in parallel to each other, between the gate terminal GL2 of the second latch transistor ML2 and the source terminal SS.

In this way, advantageously according to this embodiment, the latch circuit 13 performs the functions of the resistive element Rgs coupled between the gate GG and source SS terminals of the driving configuration according to the prior art, ensuring a correct coupling of the gate terminals GG to suitable current values supplied by the driver 12 according to the working conditions of the driving configuration 10, i.e., when the switch 11 is driven to the turn off, and respectively to the turn on.

In fact, the latch transistors, ML1 and ML2, in the configuration provided for the latch circuit 13, work so as to turn off each other according to the working condition of the switch 11. These latch transistors are in particular N channel MOS transistors with low voltage (in particular, equal to 5V).

It is in fact evident that, due to the crossed coupling of the gate and drain terminals of the latch transistors, ML1 and ML2, the turn on of the first latch transistor ML1 causes the turn off of the second latch transistor ML2, since it nullifies its voltage value Vgs between the gate and source terminals, which are short-circuited to each other. Similarly, the turn on of the second latch transistor ML2 causes the turn off of the first latch transistor ML1, nullifying the voltage value Vgs between the gate and source terminals.

In this way, the value of the current injected by the control current generators, Goff and Gon, of the driver 12 closes itself on an infinite impedance (corresponding to the latch transistor when off) and thus, with a few μA of supplied current the driving configuration 10 according to the present disclosure is able to develop a voltage value sufficient to ensure a correct turn on, and respectively turn off, of the switch 11. The value of the voltage produced by the latch circuit 13 on the gate terminal of the latch transistor when on is clamped by to the diodes Zener, DZ1 and DZ2, and the capacitors, C1 and C2, connected between this gate terminal and the source terminal SS.

In other words, the Zener diode DZ1 and the capacitor C1 coupled to the gate terminal GL1 of the first latch transistor ML1 realize a clamp circuit 14A of a value of the current being on this gate terminal GL1. Similarly, the Zener diode DZ2 and the capacitor C2 connected to the gate terminal GL2 of the second latch transistor ML2 realize a further clamp circuit 14B of a voltage value on this gate terminal GL2.

Moreover, the capacitors, C1 and C2 coupled to the gate terminals GL1 and GL2 of the latch transistors, ML1 and ML2, are advantageously sized so as to overcome the parasite capacities of these gate terminals, ensuring in this way the maintenance of an ON or OFF state in the absence of a control signal.

Simulations carried out on the driving configuration 10 shown in FIG. 3 have shown switch times from an OFF state to an ON state substantially identical to those from the ON state to the OFF state, and on the order of 200 ns.

Figure 5A:
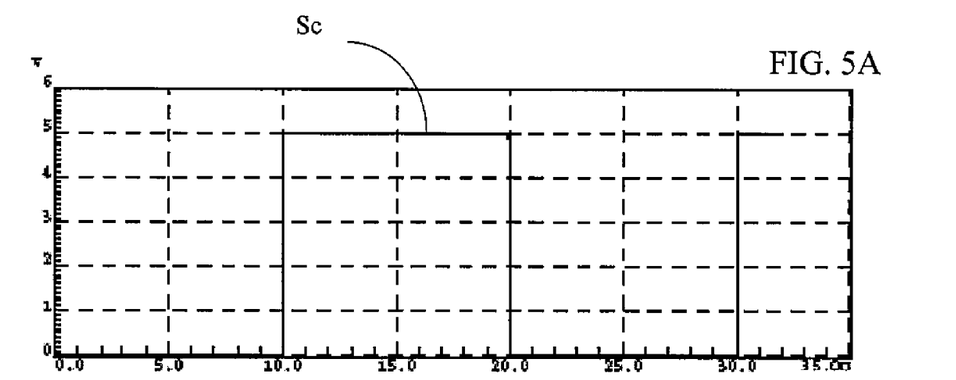
FIGS. 5A-5C show the results of a simulation carried out on the driving configuration of FIG. 3.
Figure 5B:
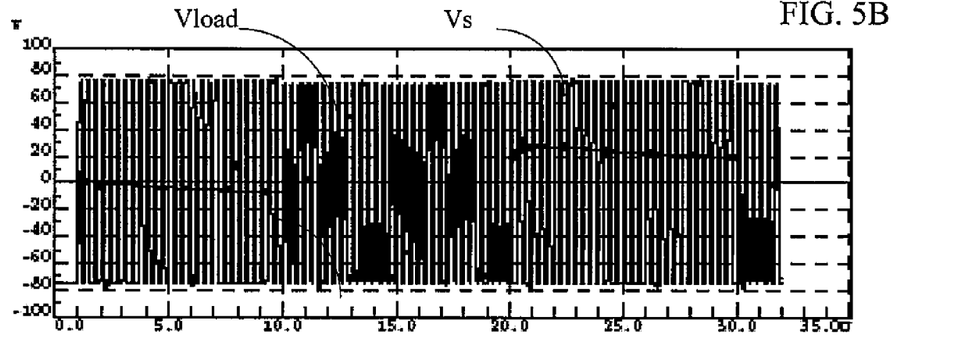
Figure 5C:
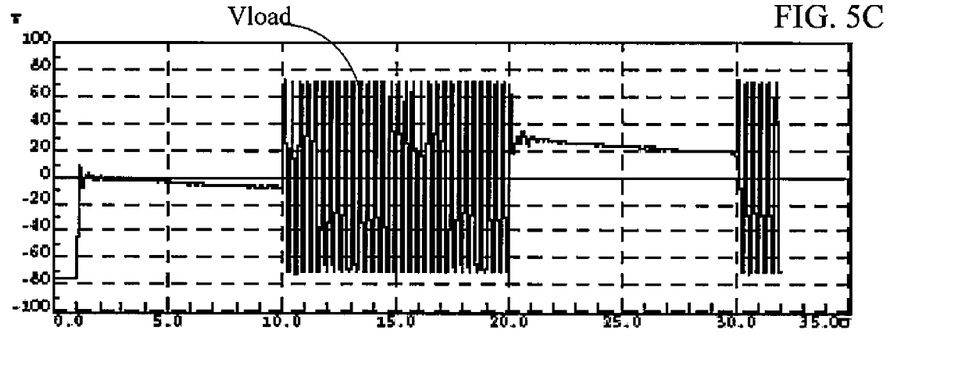

The results of these simulations are shown in FIGS. 5A-5C in which the switch 11 connects a load to a voltage signal source Vs. In particular, FIG. 5A shows a control signal Sc of the switch 11, for which a void voltage value (Sc=0) corresponds to a condition of an open switch, and a voltage value equal to Vpp (Sc=5V) corresponds to a condition of a closed switch. FIG. 5B shows the source voltage signal Vs and the voltage signal that is obtained on the load Vload, overlapped onto each other while FIG. 5C reports the signal on the load Vload only. Thus, it is verified that the switch 11 works correctly when on (signal Sc=5V) and reports the source voltage value Vs onto the load (Vs=Vload), as soon as the control signal Sc is brought to Vpp; moreover the switch 11 works correctly when off (signal Sc is brought to 0) and immediately unlatches the load as soon as the control voltage signal Sc is interrupted (at 20 microseconds in FIG. 5C).

In other words, the driving configuration 10 according to the present disclosure meets the need for a quick switch transient for a switch driven in high voltage while achieving an unusual implementing simplicity.

Such a driving configuration, however, shows a considerable power dissipation, essentially due to the continuous charge/discharge of the capacitors, C1 and C2, connected to the gate terminals, GL1 and GL2, of the latch transistors, ML1 and ML2, of the latch circuit 13.

Moreover, it is problematic to obtain a current that crosses the channel of the latch transistor when on suitable to develop at least one threshold voltage so as to turn on the other latch transistor and to trigger a positive reaction.

Figure 4:
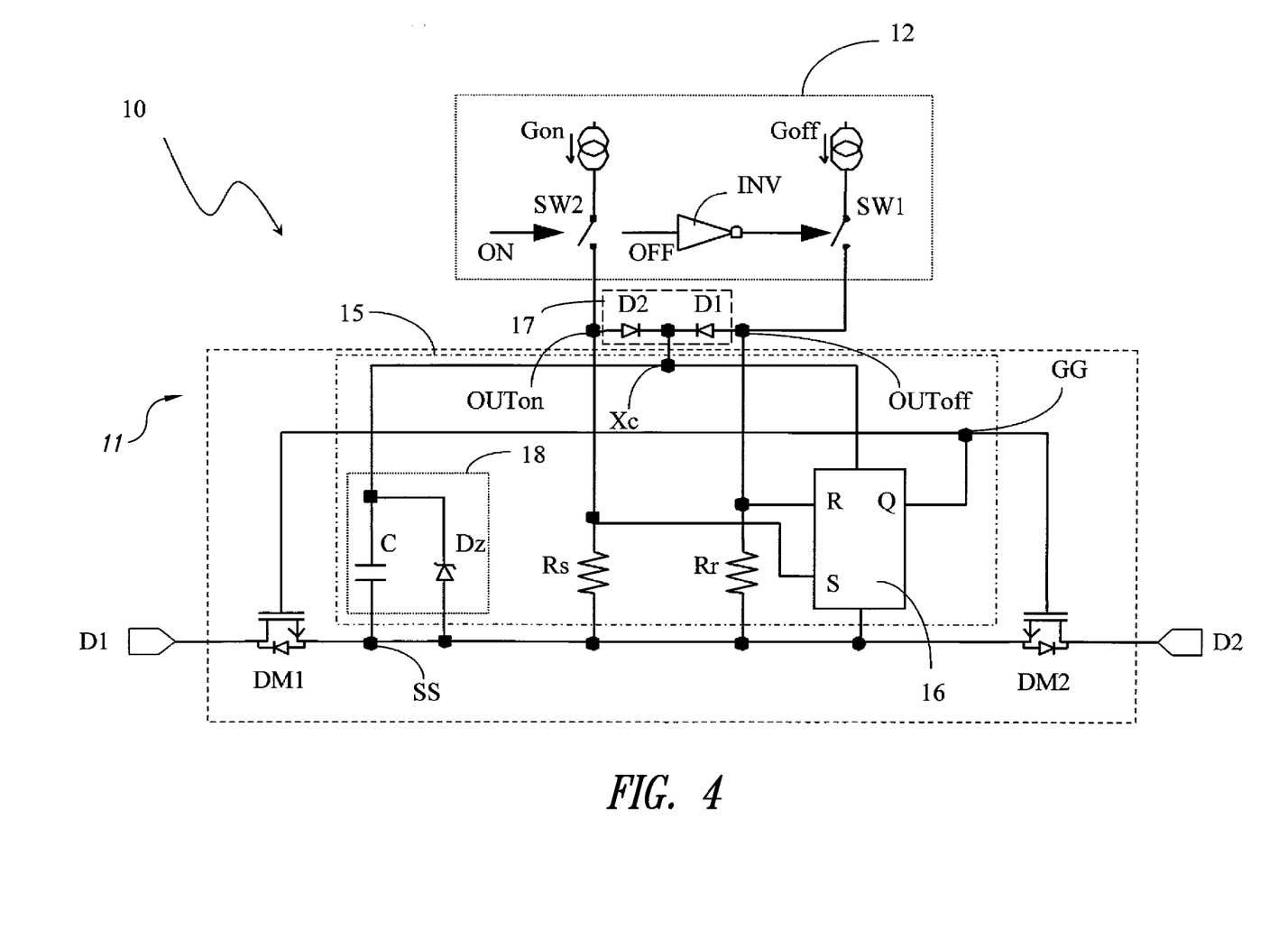
FIG. 4 schematically shows a further embodiment of the driving configuration according to the present disclosure.

An improving alternative embodiment of the driving configuration 10 according to the present disclosure is schematically shown in the embodiment of FIG. 4.

In particular, the driving configuration 10 includes a switch 11 driven by a driver 12 and has a latch circuit 15 inserted between the gate GG and source SS terminals of the transistors, DM1 and DM2, of the switch 11.

Advantageously according to this alternative embodiment, the latch circuit 15 includes a digital latch or flip-flop 16 of the Set/Reset type, usually realized with two logic gates of the NOR type.

In particular, the flip-flop 16 enables a change from an ON state to an OFF state simply by means of SET and RESET signals received as voltage signals across respective set Rs, and reset, Rr, resistances, suitably coupled to the set S and reset R terminals of the flip-flop 16.

More in detail, the flip-flop 16 is coupled between an inner circuit node Xc and the source terminal SS, and it has:

a reset terminal R connected to the first output terminal OUToff of the driver 12, as well as to the source terminal SS by means of the reset resistance Rr;

a set terminal S connected to the second output terminal OUTon of the driver 12, as well as to the source terminal SS by means of the set resistance Rs; and an output terminal Q connected to the gate terminal GG.

Further, the latch circuit 15 includes a Zener diode DZ and a capacitor C coupled, in parallel to each other, between the inner circuit node Xc and the source terminal SS. Also in this case, the Zener diode DZ and the capacitor C realize a clamp circuit 18 of the supply voltage value on the inner circuit node Xc.

In this way, advantageously according to this embodiment, the value of the current injected onto the set and reset resistances, Rs and Rr, by the driver 12 must not close itself on variable and unknown channel resistances. Thus, there is no need of over-sizing the elements of the circuit for ensuring always the correct switch of the DM1 and DM2 transistors, also in limit cases (so called worst cases).

In particular, it is to be emphasized that, due to the use of the latch circuit 15 with flip-flop 16, the value of the resistances involved in the driving of the DM1 and DM2 transistors are known and thus the current can be sized with greater precision and without waste.

The proposed driving configuration 10 is supplied with a supply voltage corresponding to the one necessary for the correct working of its components, in particular those used for realizing the NOR gates of the flip-flop 16.

To do this, the driving configuration 10 includes a rectifier 17 inserted between the output terminals, OUToff and OUTon, of the driver 12 and the supply inner circuit node Xc of the flip-flop 16. In particular, the rectifier 17 has a first diode D1 and a second diode D2 coupled in counter-series to each other, between these output terminals, OUToff and OUTon, and interconnected in correspondence with the inner circuit node Xc.

In this way, advantageously according to this embodiment, a supply voltage value for the flip-flop 16 is taken by rectifying a charge value of parasitic capacitances associated with the control current generators, Goff and Gon, comprised in the driver 12, this supply value being always refreshed at each switch carried out by the switch 11.

In consequence, the capacitor C of the clamp circuit 18 is not continuously loaded and unloaded, but its energy is preserved for ensuring the state of the switch 11 for long periods of time.

Advantageously according to the present disclosure, the driving configuration 10 described with reference to FIG. 4 realizes the driving for a high voltage switch able to associate, with the characteristic of low current consumption, a quick switching transient or time.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety.

Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driving circuit for a switch that includes first and second transistors coupled in series to each other and to relative intrinsic diodes in antiseries and driven by the driving circuit, wherein the driving circuit comprises: at least one first and one second output terminal coupled to the switch and adapted to supply the switch with a first control signal for driving said switch in a first working state and a second control signal for driving said switch in a second working state, and in that it comprises at least one latch circuit coupled between respective common gate and source terminals of said first and second transistors and adapted to supply said common gate terminal with said first and second control signals, respectively, according to said working state for the turn off, and respectively the turn on, of said first and second transistors; and at least one first and one second generator of said control signals, connected, by means of respective first and second switches driven by respective control signals, to said first and second output terminals of said driving circuit.

2. The driving circuit according to claim 1, wherein said latch circuit comprises at least one first and one second latch transistor coupled between said common gate and source terminals and coupled in positive reaction to each other, said first latch transistor coupled between said first output terminal of said driving circuit and said common source terminal and having a gate terminal coupled to said common gate terminal and said second latch transistor coupled between said second output terminal of said driving circuit, in turn coupled to said common gate terminal, and said common source terminal and having a gate terminal coupled to said first output terminal of said driving circuit.

3. The driving circuit according to claim 1, wherein said latch circuit further comprises respective clamp circuits coupled between said first and second gate terminals, respectively, and said common source terminal.

4. The driving circuit according to claim 3, wherein each of said clamp circuits comprises at least one Zener diode and one capacitor coupled in parallel to each other and coupled between said first and second gate terminals and said common source terminal.

5. The driving circuit according to claim 1, wherein said latch transistors are low voltage N channel MOS transistors, of about 5V.

6. The driving circuit according to claim 1, wherein said latch circuit comprises at least one flip-flop coupled to said common source terminal and having:
a reset terminal coupled to said first output terminal of said driving circuit and to said common source terminal by means of a reset resistance;
a set terminal coupled to said second output terminal of said driving circuit and to said common source terminal by means of a set resistance; and
an output terminal coupled to said common gate terminal.

7. The driving circuit according to claim 6, wherein said flip-flop is supplied through a circuit node coupled by means of a rectifier to said first and second output terminals of said driving circuit.

8. The driving circuit according to claim 7, wherein said rectifier comprises first and second diodes coupled in counter-series to each other and between said first and second output terminals of said driving circuit and interconnected to each other in correspondence with said circuit node.

9. The driving circuit according to claim 8, further comprising a clamp circuit coupled between said circuit node and said common source terminal 10. The driving circuit according to claim 9, wherein said clamp circuit comprises at least one Zener diode and one capacitor coupled in parallel to each other and between said inner circuit node and said common source terminal.

11. The driving circuit according to claim 5, wherein said switch comprises a high voltage switch that is a higher voltage than the low voltage latch transistors.

12. The driving circuit according to claim 1 wherein said first and second transistors are DMOS transistors.

13. A switch circuit, comprising:
a switch having first and second transistors coupled in series to one another; and
a driving circuit coupled to the switch, the driving circuit comprising:
a first current source connected by means of a first switch driven by a control signal to a first latch transistor and coupled to a control terminal of a second latch transistor;
a second current source connected by means of a second switch driven by a control signal to the second latch transistor and to a control terminal of the first latch transistor;
the first and second latch transistors each coupled to a common source terminal of the first and second transistors; and
first and second clamp circuits coupled between the respective control terminals of the first and second latch transistors and the common source terminal.

14. The switch circuit of claim 13, wherein the first and second current sources are coupled to the respective latch transistors by first and second respective switches, the second switch having a control terminal to receive a control signal and the first switch having a control terminal to receive the control signal in an inverted state.

15. The circuit of claim 13, wherein the first and second clamp circuits each comprise a Zener diode coupled in parallel with a capacitor.

16. A switch circuit, comprising:
a driving circuit comprising first and second current sources coupled to respective first and second outputs via respective first and second switches, the second switch controlled by a control signal and the first switch controlled by an inverted control signal; and
a switch comprising first and second transistors coupled in series to each other and to relative intrinsic diodes in antiseries and having a first input coupled to the first output of the driving circuit and a second input coupled to the second output of the driving circuit, the first input coupled to a first terminal of a latch circuit and the second input terminal coupled to a second terminal of the latch circuit, and an output of the latch circuit coupled to control terminals of the first and second transistors, and a fourth terminal coupled to a common source terminal between the first and second transistors, the switch further comprising a clamp circuit coupled to the latch circuit and to the common source terminal.

17. The circuit of claim 16, further comprising a rectifier circuit having a first terminal coupled to the first output of the driving circuit, a second terminal coupled to the second output of the driving circuit, and a third terminal coupled to the coupling between the latch circuit and the clamp circuit.

18. The circuit of claim 17, wherein the rectifier comprises first and second diodes coupled in counter-series to each other between the first and second terminals and having a common node between them that is coupled to the third terminal of the rectifier circuit.

19. A driving circuit for a switch that includes first and second transistors coupled in series to each other and to relative intrinsic diodes in antiseries and driven by the driving circuit, wherein the driving circuit comprises at least one first and one second output terminal coupled to the switch and adapted to supply the switch with a first control signal for driving said switch in a first working state and a second control signal for driving said switch in a second working state, and in that it comprises at least one latch circuit coupled between respective common gate and source terminals of said first and second transistors and adapted to supply said common gate terminal with said first and second control signals, respectively, according to said working state for the turn off, and respectively the turn on, of said first and second transistors, wherein the latch circuit comprises respective clamp circuits coupled between said first and second gate terminals, respectively, and said common source terminal, wherein each of the clamp circuits comprises at least one Zener diode and one capacitor coupled in parallel to each other and coupled between said first and second gate terminals and said common source terminal.

20. The driving circuit according to claim 19, wherein said driving circuit comprises at least one first and one second generator of said control signals, connected, by means of respective first and second switches driven by respective control signals, to said first and second output terminals of said driving circuit.

21. The driving circuit according to claim 20, wherein said latch circuit comprises at least one first and one second latch transistor coupled between said common gate and source terminals and coupled in positive reaction to each other, said first latch transistor coupled between said first output terminal of said driving circuit and said common source terminal and having a gate terminal coupled to said common gate terminal and said second latch transistor coupled between said second output terminal of said driving circuit, in turn coupled to said common gate terminal and said common source terminal and having a gate terminal coupled to said first output terminal of said driving circuit.

22. A switch circuit, comprising:
  a switch having first and second transistors coupled in series to one another; and
  a driving circuit coupled to the switch, the driving circuit comprising:
    a first current source coupled to a first latch transistor and coupled to a control terminal of a second latch transistor;
    a second current source coupled to the second latch transistor and to a control terminal of the first latch transistor;
    the first and second latch transistors each coupled to a common source terminal of the first and second transistors;
    first and second clamp circuits coupled between the respective control terminals of the first and second latch transistors and the common source terminal; and
    wherein the first and second current sources are coupled to the respective latch transistors by first and second respective switches, the second switch having a control terminal to receive a control signal and the first switch having a control terminal to receive the control signal in an inverted state.

23. The switch circuit according to claim 22, wherein said latch circuit further comprises respective clamp circuits coupled between a first gate terminal and second gate terminal of the first and second transistors and said common source terminal.

24. The driving circuit according to claim 23, wherein each of said clamp circuits comprises at least one Zener diode and one capacitor coupled in parallel to each other and coupled between said first and second gate terminals and said common source terminal.

25. A switch circuit, comprising:
  a switch having first and second transistors coupled in series to one another; and
  a driving circuit coupled to the switch, the driving circuit comprising:
    a first current source coupled to a first latch transistor and coupled to a control terminal of a second latch transistor;
    a second current source coupled to the second latch transistor and to a control terminal of the first latch transistor;
    the first and second latch transistors each coupled to a common source terminal of the first and second transistors; and
    first and second clamp circuits coupled between the respective control terminals of the first and second latch transistors and the common source terminal, wherein the first and second clamp circuits each comprise a Zener diode coupled in parallel with a capacitor.

26. The switch circuit according to claim 25, wherein said latch transistors are low voltage N channel MOS transistors, of about 5V.

* * * * *

UNITED STATES PATENT AND TRADEMARK OFFICE
CERTIFICATE OF CORRECTION

PATENT NO. : 7,521,984 B2
APPLICATION NO. : 11/753839
DATED : April 21, 2009
INVENTOR(S) : Giulio Ricotti It is certified that error appears in the above-identified patent and that said Letters Patent is hereby corrected as shown below:

Column 8
Lines 47, "according to said working state for the turn off," should read as -- according to said working states for the turn off, --

Column 9
Line 1, "coupled between said first and second gate terminals," should read as
-- coupled between first and second gate terminals, --

Lines 8-9, "The driving circuit according to claim 1, wherein said latch transistors are low voltage N channel MOS transistors," should read as -- The driving circuit according to claim 2, wherein said latch transistors are low voltage N channel MOS transistors, --

Line 32, "said common source terminal" should read as -- said common source terminal. --

Lines 35-36, "capacitor coupled in parallel to each other and between said inner circuit node and said common source terminal." should read as -- capacitor coupled in parallel to each other and between said circuit node and said common source terminal. --

Column 10
Line 19, "and a fourth terminal coupled to a common" should read as -- and a third terminal coupled to a common --

Line 45, "according to said working state for the turn off," should read as -- according to said working states for the turn off, --

Signed and Sealed this

Eighteenth Day of August, 2009

David J. Kappos
*Director of the United States Patent and Trademark Office*